US006696364B2

(12) United States Patent
Gelmi et al.

(10) Patent No.: US 6,696,364 B2
(45) Date of Patent: Feb. 24, 2004

(54) METHOD FOR MANIPULATING MEMS DEVICES, INTEGRATED ON A WAFER SEMICONDUCTOR AND INTENDED TO BE DICED ONE FROM THE OTHER, AND RELEVANT SUPPORT

(75) Inventors: Ilaria Gelmi, Albiate (IT); Simone Sassolini, Sansepolcro (IT); Stefano Pozzi, Milan (IT); Massimo Garavaglia, Robecchetto con Induno (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 137 days.

(21) Appl. No.: 10/214,998

(22) Filed: Aug. 8, 2002

(65) Prior Publication Data

US 2003/0077881 A1 Apr. 24, 2003

Related U.S. Application Data

(60) Provisional application No. 60/338,903, filed on Oct. 22, 2001, and provisional application No. 60/343,871, filed on Oct. 19, 2001.

(51) Int. Cl.$^7$ ............... H01L 21/302; H01L 21/461; H01L 21/469
(52) U.S. Cl. ............... 438/704; 438/735; 438/738; 438/742; 438/756
(58) Field of Search ............... 438/704, 735, 438/738, 742, 756; 257/704; 359/224, 90 V

(56) References Cited

U.S. PATENT DOCUMENTS

| 5,798,283 A | * | 8/1998 | Montague et al. ............ 438/24 |
| 5,919,548 A | * | 7/1999 | Barron et al. ............... 428/138 |
| 5,963,788 A | * | 10/1999 | Barron et al. ................. 438/48 |
| 6,024,801 A | * | 2/2000 | Wallace et al. ................ 134/1 |
| 6,232,150 B1 | * | 5/2001 | Lin et al. .................... 438/119 |
| 6,238,580 B1 | * | 5/2001 | Cole et al. .................... 216/2 |
| 6,310,018 B1 | * | 10/2001 | Behr et al. ................... 510/175 |
| 6,407,560 B1 | * | 6/2002 | Walraven et al. ........... 324/752 |
| 6,428,713 B1 | * | 8/2002 | Christenson et al. ........... 216/2 |

FOREIGN PATENT DOCUMENTS

JP          10-107339      *  7/1998

OTHER PUBLICATIONS

R.L. Alley et al., The Effect of Release–Etch Processing On surface Microstructure stiction, Solid–State Sensor and Actuator Workshop, 1992, 5$^{th}$ techincal Digest, IEEE, 1992 pp. 202–207.*

Michaei R. Huston et al. Ammonium Fluoride Anti–Stiction treatments for Polysilicon Microstructures, The *th International Confereence on Solid–State Sensors and Acttuators and Eurosensors ix, Stockholm, Sweden, Jun. 25–29, 1995 pp. 210–213.*

Uthara Srinivasan et al., Self–Assembled Fluorocarbon Films for enhanced stiction Reduction , Transducers 1997, 1997 International Conference on Solid–State Sensors and Actuators, Chicago, Jun. 16–19, 1997 pp. 1399–1402.*

(List continued on next page.)

*Primary Examiner*—Wael Fahmy
*Assistant Examiner*—Shrinivas H Rao
(74) *Attorney, Agent, or Firm*—Allen, Dyer, Doppelt, Milbrath & Gilchrist, P.A.; Lisa K. Jorgenson

(57) ABSTRACT

A method for manipulating MEMS devices integrated on a semiconductor wafer and intended to be diced one from the other includes bonding of the semiconductor wafer including the MEMS devices on a support with interposition of a bonding sheet. The method may also include completely cutting or dicing of the semiconductor wafer into a plurality of independent MEMS devices, and processing the MEMS devices diced and bonded on the support in a treatment environment for semiconductor wafers. A support for manipulating MEMS devices is also included.

18 Claims, 3 Drawing Sheets

OTHER PUBLICATIONS

Yong–II Lee et al., "Dry release for Surface Micromachining with HF Vapor–Phase Etching", Journal Of Microelctromechanical Systems, vol. 6 No. 3, Sep. 1997, pp. 226–233.*

Uthara Srinivasan et al., "Alkyltrichlorosilane– BAsed Self–Assembled Monolayer Films for Stiction reduction in Silicon Micromachines" Journal Of Microelctromechanical Systems, vol. 7 No. 2, Jun. 1998 pp. 252–260.*

Won Ick Jang, "Dry release process of anhydrous HF gas–phase etching for the fabrication of vibrating micro gyroscope", Conference on Device and process technologies for MEMS and Microelelctronics, Australia Oct. 1999, SPIE vol. 3892, pp. 332–335.*

Ilaria Gelmi et al., "Stiction–free Release Etch with Anhydrous HF/Water Vapor Processes", Micromachining and Microfabrication Process technology Vii, Proceedings of SPIE vol. 4557 pp. 58–68.*

Won Ick Jang et al., "Surface micromachined elctrostatic diaphragm micropump", Conference on Electronics and structures for MEMS, Australia, Oct. 1999, SPIE vol. 3891, pp. 395–402.*

* cited by examiner

METHOD FOR MANIPULATING MEMS DEVICES, INTEGRATED ON A WAFER SEMICONDUCTOR AND INTENDED TO BE DICED ONE FROM THE OTHER, AND RELEVANT SUPPORT

RELATED APPLICATIONS

The present application is based upon U.S. provisional application serial No. 60/343,871 filed on Oct. 19, 2001 and U.S. provisional application serial No. 60/338,903 filed on Oct. 22, 2001, the entire disclosure of both of which are incorporated herein by reference.

FIELD OF THE INVENTION

The present invention relates to a method for manipulating MEMS devices. The invention also relates to a support useful for the manipulation or processing of MEMS devices integrated on a semiconductor wafer and intended to be diced one from the other. Particularly, but not exclusively, the invention relates to a method for manipulating MEMS devices during a treatment in an anhydrous HF solution, and the following description is made with reference to this application field with the only purpose of simplifying its explanation.

BACKGROUND OF THE INVENTION

As it is well known, many types of micro-electromechanical devices are produced. They are also called MEMS, an acronym for "Micro Electro-Mechanical Systems", and comprise, but are not limited to mirrors, accelerometers and motors. MEMS devices are formed by suitable surface micro-machining equipment and typically have a common feature, that is, they typically require the removal of a sacrificial layer, usually an oxide, that then allows the device to operate.

The removal of a sacrificial oxide layer is a crucial phase for MEMS devices. The sacrificial oxide layer of MEMS devices is traditionally removed by immersing the wafer on which the devices have been formed in an aqueous HF solution. Unfortunately when the wafer is dried, superficial forces may push potential polysilicon cantilever surfaces toward the substrate. When such surfaces contact the wafer surface, an irreversible connection or stiction may be created that makes the device unusable.

One of the fundamental problems of the processes for manipulating MEMS devices is the desirability of reducing to a minimum the risk of bonding together the polysilicon portions and the wafer surface on which such MEMS devices are formed. To address this requirement it is known to use a process for removing the sacrificial oxide layer that utilizes anhydrous HF and steam.

A known apparatus to provide the removal in anhydrous HF is schematically shown in FIG. 1 and globally indicated with 1. The apparatus 1 essentially comprises a group 2 of gas supplies necessary for operating the removal process and which are connected, together with a steam generator 3, to an etch chamber 4.

In the etch chamber 4, the process for removing the sacrificial oxide layer of the MEMS devices is performed to allow the activation of the devices. Such an etch chamber 4 is suitably equipped with a pressure controller 5.

Several MEMS devices, particularly sensors, may require a single packaging operation. At present, the wafers comprising such MEMS devices are diced into single devices, or separated after they are freed by removing the sacrificial oxide layer, that is after the treatment in the apparatus 1.

Furthermore, known apparatus such as the one shown in FIG. 1, but generally all apparatus for treating MEMS devices now in commerce, are designed for manipulating entire wafers which may be 6 and 8 inches in diameter. Unfortunately, after the removal treatment the structure of such MEMS devices is quite fragile and a great number of MEMS devices can be damaged. It is known to dice the wafer before this final treatment phase as a method for reducing the risk of damage to the MEMS devices.

Particularly, a generic semiconductor wafer is treated according to the following process flow by the apparatus 1:
 a. definition of a plurality of MEMS devices 10 by a so-called trench etch;
 b. protection of the etch front with a protection sheet called stick foil;
 c. bonding of the semiconductor wafer on a support;
 d. complete cutting, that is dicing of the single MEMS devices integrated on the semiconductor wafer;
 e. removal of the protection sheet from the etch front;
 f. release of the MEMS devices in anhydrous HF;
 g. picking of the diced MEMS devices;
 h. measuring of the MEMS devices' functionality by testing apparatus, such phase being not mandatory;
 i. packaging on suitable provisional or final supports depending on the measuring or testing needs, also during this phase;
 j. further setting on the carrying support if a first provisional support is utilized.

The process flow just described is nevertheless the current best approach in the case of MEMS devices. The dicing phase or the cutting of the pieces is normally realized by a saw and a water jet. Such a phase cannot be moved to the end of the process because it would lead to the destruction of most of the MEMS devices. The MEMS devices are free structures which can move after the last process step that frees them by etching the sacrificial oxide on which the structures lay, as it is schematically shown in FIGS. 2A to 2D. Particularly, such figures show the progressive removal of the sacrificial oxide layer 11 that holds the MEMS devices 10 on a substrate 12.

Treatment methods of MEMS devices, formed according to the prior art, pre-cut the single MEMS devices before the final etching phase is performed. The picking, positioning and assembling final phases of the diced MEMS devices relates to single dies to be manipulated one-by-one, leading to long and laborious operations.

Furthermore, in case it is necessary to make further electrical and reliability evaluations, all the relevant operations are not standard ones since they are made by hand on single devices, as occurs when assembling the devices.

To conclude, the activation of the final phase related to diced devices turns out to be a non-standard, extremely tedious and inefficient process since the picking of the diced devices is by hand. Finally, it should be noted that all of the known apparatus components are optimized to handle (manage) silicon wafers of the above cited dimensions.

SUMMARY OF THE INVENTION

In view of the foregoing background, an embodiment of the invention provides a method for manipulating MEMS devices which are already diced, thereby overcoming the limitations and the disadvantages that presently beset the treatment methods and apparatus according to the prior art.

One of the principles on which embodiments of the present invention are based is that of processing devices which are already diced, by using a support having dimensions analogous to the ones of the wafer before its dicing occurs, so that an easy manipulation of the MEMS devices, diced by using known apparatus, is allowed.

Presented is a method for manipulating MEMS devices integrated on a semiconductor wafer and intended to be diced one from the other, the method preferably comprising:

a. bonding of the semiconductor wafer comprising the MEMS devices on a support with interposition of a bonding sheet;

b. complete cutting or dicing of the semiconductor wafer into a plurality of independent MEMS devices; and c. processing the MEMS devices diced and bonded on the support in a treatment environment for semiconductor wafers.

Additionally presented is a support for manipulating MEMS devices.

BRIEF DESCRIPTION OF THE DRAWINGS

The features and advantages of the manipulation method and of the support according to the invention will be apparent from the following description of an embodiment thereof, given by way of non-limitative example with reference to the accompanying drawings.

DETAILED DESCRIPTION OF THE PREFERRED EMBODIMENTS

Figure 1:
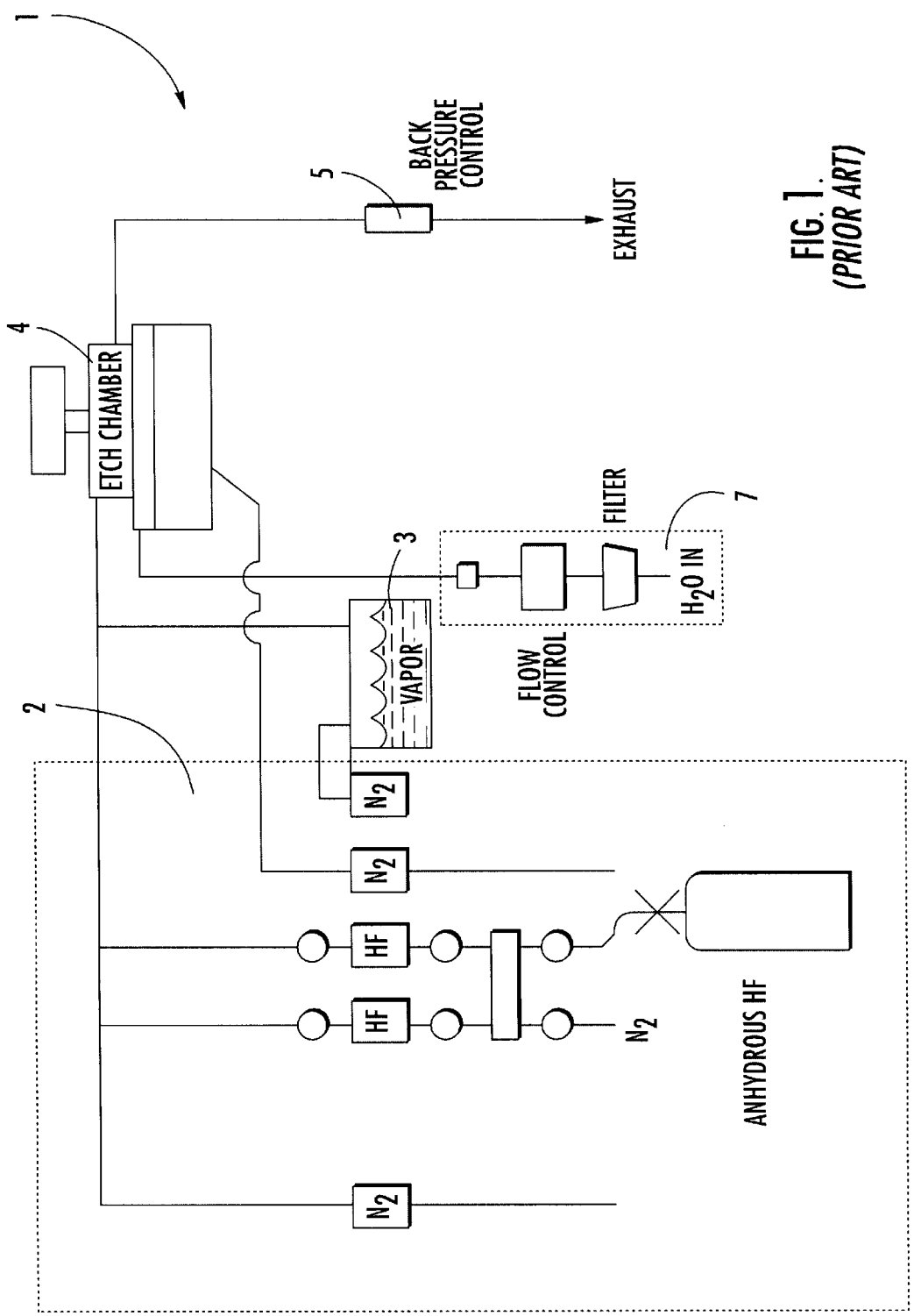
FIG. 1 schematically shows an apparatus for the treatment in anhydrous HF of semiconductor wafers, according to the prior art.
Figure 2A:
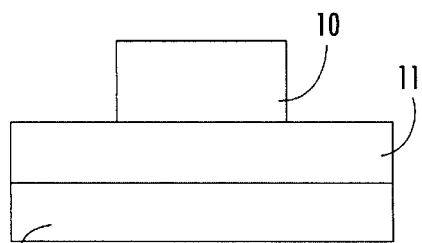
FIGS. 2A to 2D schematically show different stages of the treatment in anhydrous HF, according to the prior art for MEMS devices integrated on a semiconductor wafer.
Figure 2B:
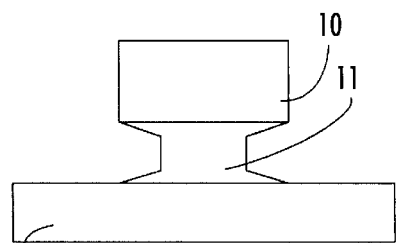
Figure 2C:
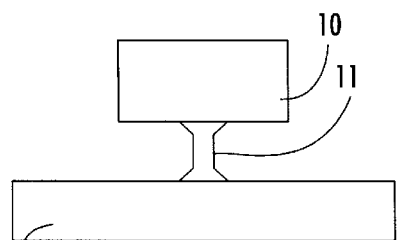
Figure 2D:
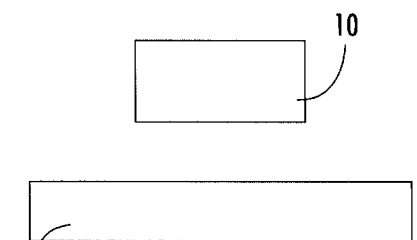
Figure 3:
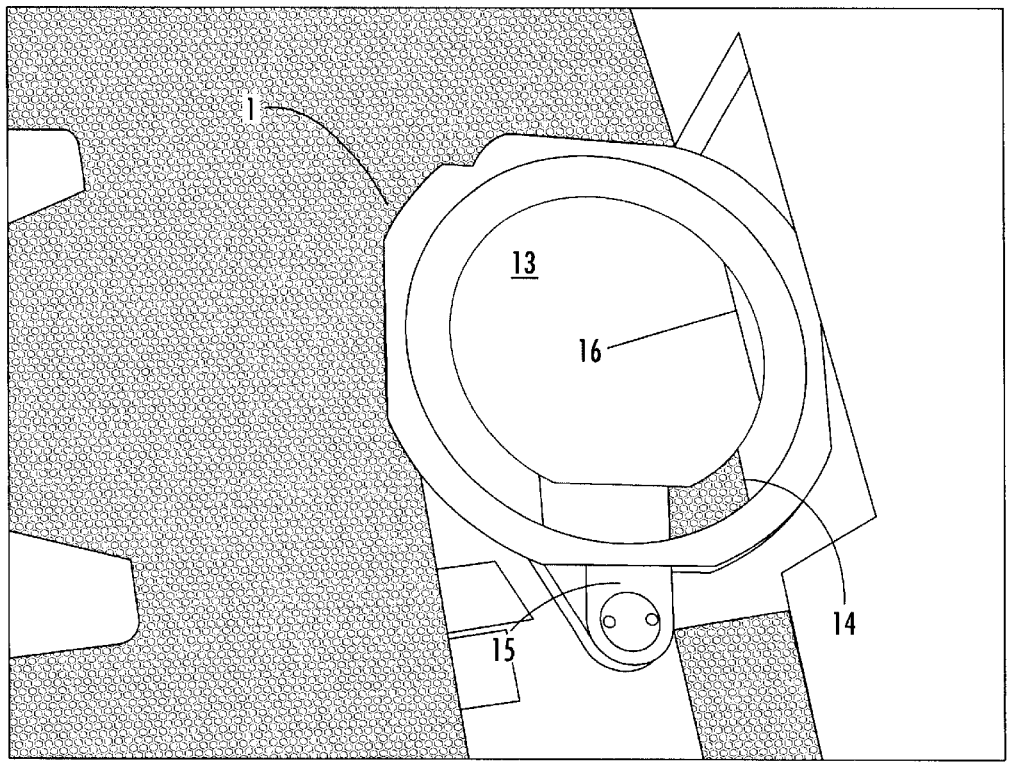
FIG. 3 shows a support of MEMS devices for carrying out the manipulation method according to an embodiment of the invention.

With reference to such figures and particularly to FIG. 3, numeral 13 globally and schematically indicates a support of MEMS devices integrated on a semiconductor wafer and intended to be diced one from the other, such support being formed according to an embodiment of the invention. Particularly, the support 13 shows dimensions analogous to the ones of the semiconductor wafers and thus can be used by the apparatus already in commerce, such as the known apparatus 1 used for the treatment in anhydrous HF shown with reference to FIG. 1.

Advantageously according to an embodiment of the invention, the support 13 for MEMS devices allows the activation of already diced devices by removal of the sacrificial oxide layer, thereby reducing the risk of damaging such devices. Particularly the support 13 shown in FIG. 3 comprises a flat frame (FF). The support 13 generally comprises an additional supporting wafer which is suitable for supporting the semiconductor wafer comprising the MEMS devices. Particularly, the semiconductor wafer is separated and mounted on the additional supporting wafer which is equipped with a protective film on both of its sides.

The support 13, joined to the semiconductor wafer, is mounted on a crown or tray 14, made out of metal or hard plastic material, in order to be charged in the treatment apparatus 1. Particularly the tray 14 is mounted on an arm 15 which inserts the support 13 in a suitable opening 16 for receiving the wafer, such an opening being already provided in known apparatus.

It should be noted that flat frame supports are normally available with respect to treatment apparatus in anhydrous HF presently in commerce. Flat frame supports turn out to be particularly handy during the whole treatment, until the assemblage of the single devices.

Figure 4:
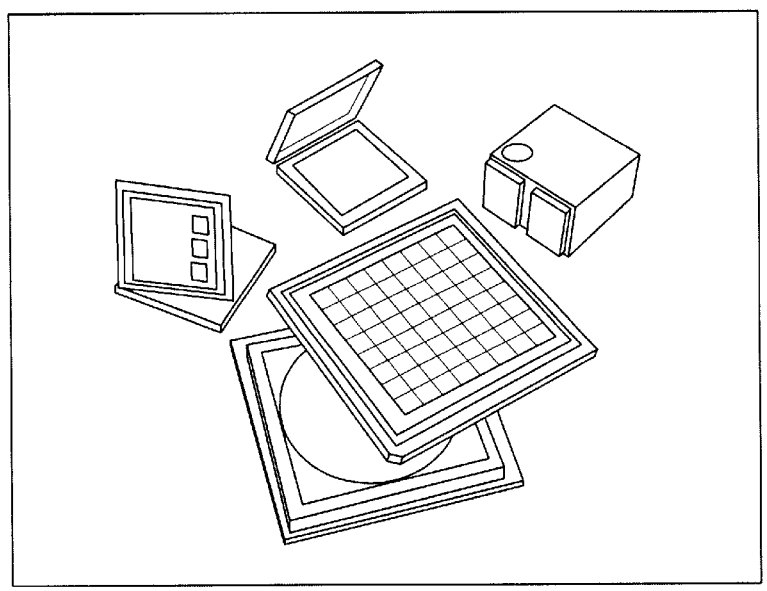
FIG. 4 shows further embodiments of the support of FIG. 3.
Figure 5:
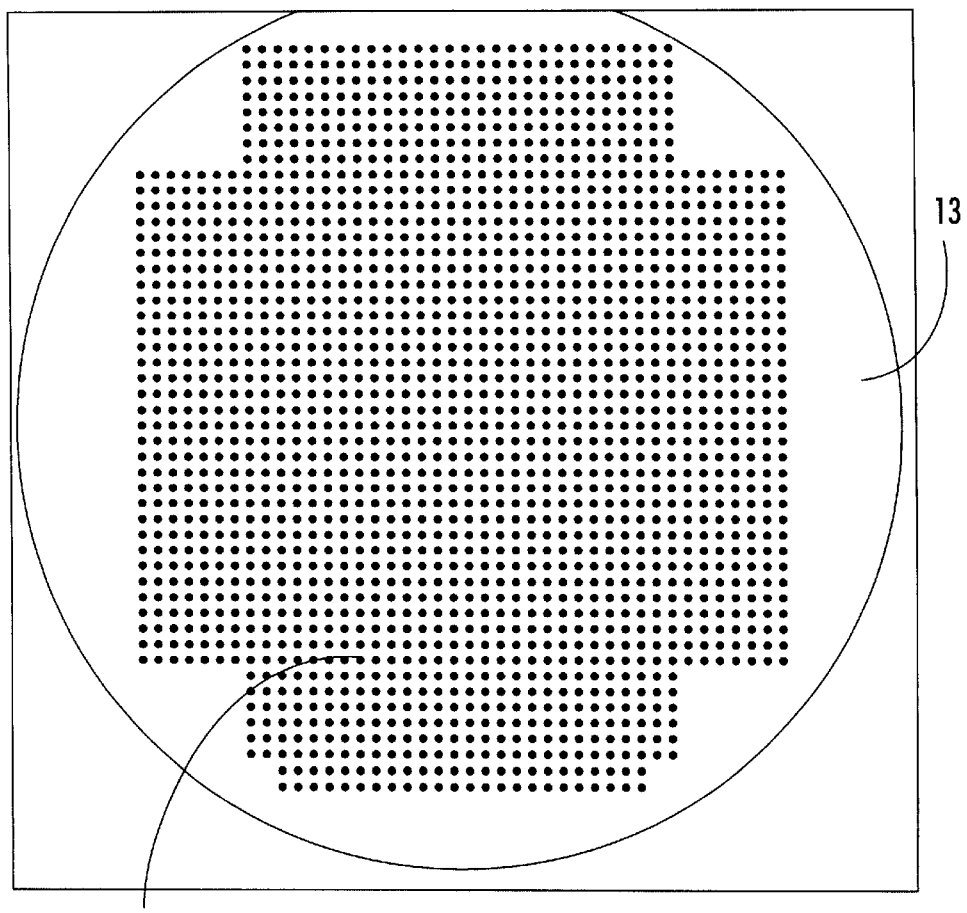
FIG. 5 shows a preferred embodiment of the support of FIG. 3.

According to an embodiment of the invention, flat frame supports are standard and are available in commerce since they are used for automatically testing the reliability for wafers already diced into pieces. It is equally possible to use other known types of commercial supports, such as the so called waffle packages or the containers GEL-PAK series AD or VR™, as schematically shown in FIG. 4.

It is now described the process flow of MEMS devices integrated on a semiconductor wafer and which are to be diced one from the other by a known apparatus 1 that uses a flat frame support 13 according to an embodiment of the invention. The initial steps correspond to the ones described in the prior art—they are the formation phases of a plurality of MEMS devices on the semiconductor wafer.

The invention provides a new manipulation method of MEMS devices, comprising the following steps:

c. bonding the semiconductor wafer comprising MEMS devices on the flat frame support 13 by an HF-resistant bonding sheet;

d. completely cutting or semiconductor wafer dicing into a plurality of independent MEMS devices; and e. treatment of the plurality of MEMS devices bonded on the support 13 in anhydrous HF;

f. automatically picking of the support 13 comprising the MEMS devices; and g. automatically assembling of MEMS devices with a pick and place apparatus.

The introduction of the support 13, particularly of the flat frame type, allows all the steps that follow the manufacturing pre-cut phase to be taken in a standard manner, since the flat frame support is a platform usually used for testing operations. It should be noted that advantageously according to an embodiment of the invention, the flat frame manipulation with the integration wafers mounted thereon, is carried out with dedicated units and it is very similar to the standard wafer manipulation.

In a preferred embodiment, schematically shown in FIG. 4, the support 13 shows a plurality 17 of holes suitable to allow single MEMS devices to have a good setting during the HF treatment phase. Such a support 13 comprises a special metal wafer having a plurality of holes 17 and having a face covered by a special gel before its treatment in anhydrous HF. Advantageously this preferred embodiment of the support 13 simplifies the automatic assembly operations with a pick and place apparatus.

Changes can be made to the invention in light of the above detailed description. In general, in the following claims, the terms used should not be construed to limit the invention to the specific embodiments disclosed in the specification and the claims, but should be construed to include all methods and devices that are in accordance with the claims. Accordingly, the invention is not limited by the disclosure, but instead its scope is to be determined by the following claims.

That which is claimed is:

1. A method for processing MEMS devices integrated on a semiconductor wafer comprising:
   bonding the semiconductor wafer comprising the MEMS devices onto a support;
   dicing the semiconductor wafer into a plurality of independent MEMS devices on the support; and
   processing the independent MEMS devices on the support in a treatment environment for semiconductor wafers.

2. The method according to claim 1 wherein bonding comprises positioning a bonding sheet between the semiconductor wafer and the support.

3. The method according to claim 1 wherein bonding comprises using an anhydrous HF-resistant glue.

4. The method according to claim 3 wherein processing comprises processing in an anhydrous HF solution.

5. The method according to claim 1 further comprising:
   automatically picking the MEMS devices; and
   automatically assembling the MEMS devices one-by-one.

6. The method according to claim 5 wherein automatically picking and assembling comprises using a pick and place apparatus.

7. The method according to claim 1 wherein the support comprises a flat frame support.

8. The method according to claim 1 wherein the support comprises a waffle package support.

9. The method according to claim 1 further comprising protecting at least one face of the support with a protection layer.

10. The method according to claim 1 wherein the steps are carried out in an apparatus for treating semiconductor wafers.

11. A method for making MEMS devices comprising:
    forming a plurality of MEMS devices integrated on a semiconductor substrate;
    bonding the semiconductor wafer comprising the MEMS devices onto a support using an anhydrous HF-resistant glue;
    dicing the semiconductor wafer into a plurality of independent MEMS devices on the support; and
    processing the independent MEMS devices on the support in an anhydrous HF solution.

12. The method according to claim 11 wherein bonding comprises positioning a bonding sheet between the semiconductor wafer and the support.

13. The method according to claim 11 further comprising:
    automatically picking the MEMS devices; and
    automatically assembling the MEMS devices one-by-one.

14. The method according to claim 13 wherein automatically picking and assembling comprises using a pick and place apparatus.

15. The method according to claim 11 wherein the support comprises a flat frame support.

16. The method according to claim 11 wherein the support comprises a waffle package support.

17. The method according to claim 11 further comprising protecting at least one face of the support with a protection layer.

18. The method according to claim 11 wherein the steps are carried out in an apparatus for treating semiconductor wafers.

* * * * *